(12) United States Patent
Schrader

(10) Patent No.: US 6,891,433 B2
(45) Date of Patent: May 10, 2005

(54) LOW VOLTAGE HIGH GAIN AMPLIFIER CIRCUITS

(75) Inventor: Victor Paul Schrader, Palo Alto, CA (US)

(73) Assignee: Linear Technologies Corporation, Milpitas, CA (US)

( * ) Notice: Subject to any disclaimer, the term of this patent is extended or adjusted under 35 U.S.C. 154(b) by 0 days.

(21) Appl. No.: 10/618,066

(22) Filed: Jul. 11, 2003

(65) Prior Publication Data

US 2005/0007195 A1 Jan. 13, 2005

(51) Int. Cl.[7] .................................................. H03F 3/45
(52) U.S. Cl. ...................................... 330/253; 330/257
(58) Field of Search .............................. 330/252, 253, 330/255, 257, 264

(56) References Cited

U.S. PATENT DOCUMENTS 6,801,087 B2 * 10/2004 Ausserlechner ............. 330/255

OTHER PUBLICATIONS

Dennis M. Monticelli, A Quad CMOS Single–Supply Op Amp with Rail–to–Rail Output Swing, IEEE Journal of Solid–State Circuits, Dec., 1986, pp1026–1034, vol. SC–21, No. 6.

G. Palmisano, G. Palumbo, and R. Salerno, A 1.5–V High Drive Capability CMOS Op–Amp, IEEE Journal of Solid State Circuits, Feb., 1999, pp 248–252, vol. 34, No. 2.

Ka Nang Leung, Philip K. T. Mok, Wing–Hung Ki, Johnny K. O. Sin, Three–Stage Large Capacitive Load Amplifier with Damping–Facotr–Control Frequency Compensation, IEEE Transactions on Solid–State Circuits, Feb., 2000, pp. 221–230, vol. 35, No. 2.

* cited by examiner

*Primary Examiner*—Steven J. Mottola
(74) *Attorney, Agent, or Firm*—Townsend and Townsend and Crew LLP

(57) ABSTRACT

In one embodiment, the present invention provides an amplifier circuit including a cascode input stage coupled to a differential stage. In another embodiment, an amplifier includes a differential stage coupled to a common gate stage. Embodiments of the present invention also include an improved low voltage amplifier using a 3-stage topology including a wide-swing folded-cascode input stage followed by a differential gain stage which provides improved gain and output compliance. Embodiments of the present invention improve the available cascode stage headroom and reject process and temperature induced parametric variations.

40 Claims, 12 Drawing Sheets

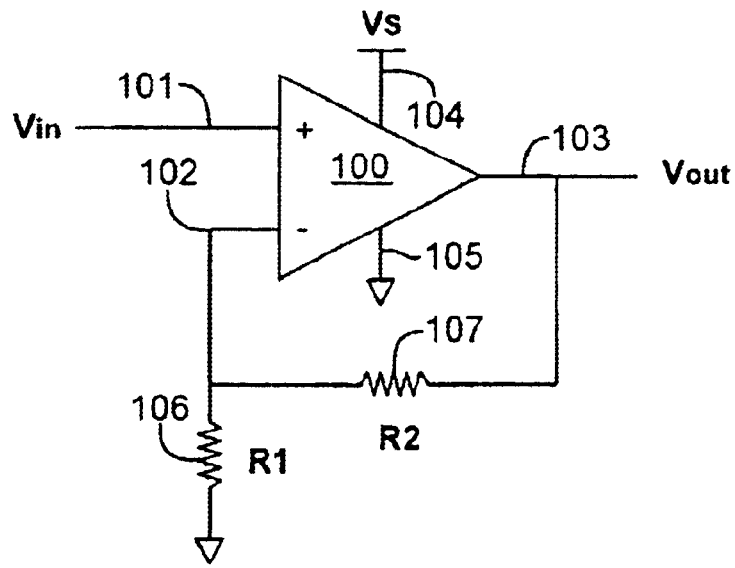
(PRIOR ART)
FIG. 1
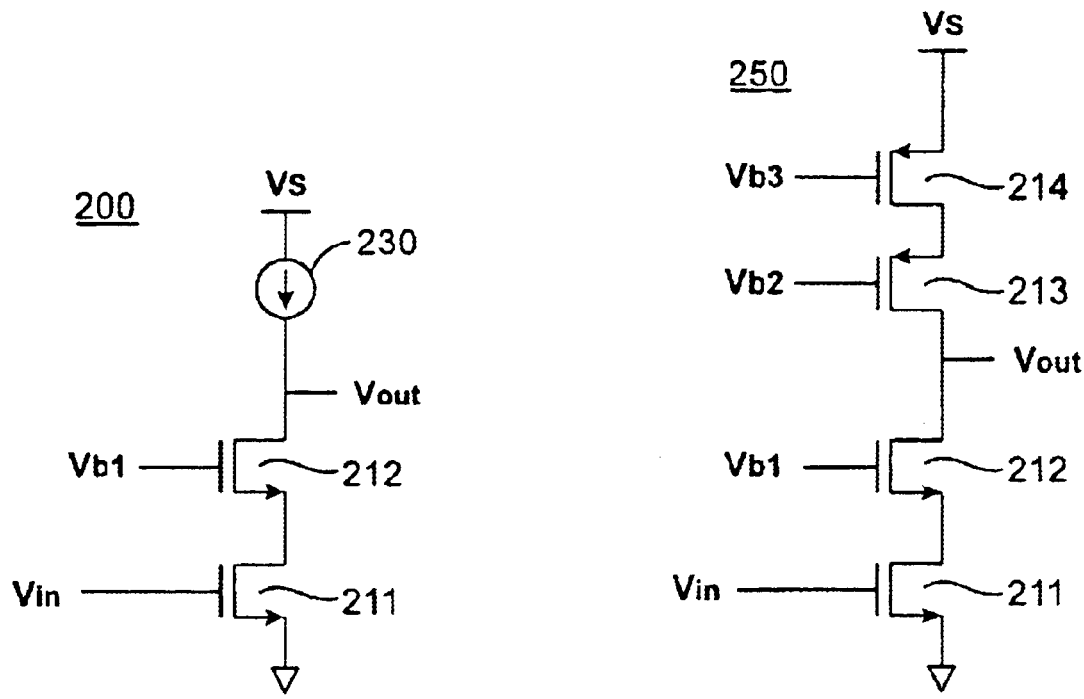
(PRIOR ART)
FIG. 2A
(PRIOR ART)
FIG. 2B

LOW VOLTAGE HIGH GAIN AMPLIFIER CIRCUITS

BACKGROUND

This invention relates to electronic circuits, and more particularly, to amplifier circuits useful in low power supply voltage applications.

Amplifier circuits are used in a variety of electronic systems for increasing the voltage, current, or power of a signal. FIG. 1 shows one example of an amplifier 100 configured to receive an input voltage, Vin, and provide an amplified voltage, Vout. Amplifier 100 includes a positive input terminal 101 ("V+"), a negative input terminal 102 ("V−"), an output terminal 103 ("Vout"), a positive supply terminal 104, and a negative supply terminal 105. Input voltage, Vin, is received on terminal 101, and the amplified voltage, Vout, is provided on terminal 103. Amplifier 100 includes feedback resistors 106 ("R1") and 107 ("R2"), which are connected in a "closed loop" to provide negative feedback. The output voltage, Vout, of amplifier 100 is related to the inputs according to the following well-known equation:

$$Vo = G(V+ - V-),$$

where "G" is the "open loop" gain of amplifier 100. If the open loop gain "G" of amplifier 100 is sufficiently large, then the "closed loop" gain of the present configuration is approximately given by the following:

$$Vo/Vin = (1 + R2/R1)$$

In some applications, an amplifier must maintain its input-output relationship with a high level of accuracy across a substantial portion of the output voltage range. However, in many actual implementations, the accuracy of an amplifier can be impaired by non-linearities in the open loop gain. To solve this problem, it is possible to utilize a closed loop configuration, such as the one illustrated in FIG. 1, with an amplifier that has a high open loop gain to achieve a closed loop system with high accuracy. Accordingly, it is desirable to have an amplifier circuit with a high open loop gain.

One trend in integrated circuit technology that has created challenges for amplifier circuit designers is the continuing reduction in the power supply voltages used in electronic systems. As power supply voltages are decreased, an amplifier's open loop gain can become constrained by the maximum and minimum voltages allowable on the amplifier's internal nodes. The difference between a maximum and minimum allowable voltage on a given node is referred to herein as "headroom." As the headroom of an amplifier's internal nodes is constrained by reductions in supply voltage, the gain of the amplifier may also have to be reduced so that intermediate signals do not exceed allowable levels.

FIGS. 2A and 2B show common amplifier circuits known in the art in order to illustrate the headroom limitations discussed above. Amplifier 200 shown in FIG. 2A is one example of a cascaded common source stage and common gate stage referred to as a "cascode" stage. The term cascode stage refers a variety of circuit structures that include one or more cascode transistors. In the present example, a simple two transistor structure is shown. In amplifier 200, NMOS transistor 211 is the input device and NMOS transistor 212 is the cascode device (i.e., the cascode transistor). Amplifier 200 also includes a current source 230. Transistor 211 receives an input signal Vin and generates a current proportional to the input voltage. Cascode transistor 212 is biased by a fixed voltage Vb1, and routes the current to the output while simultaneously increasing the output impedance of the circuit. The approximate gain of amplifier 200 is given by the following equation:

$$Vout/Vin \approx g_{m1} r_{o2} (1 + g_{m2} r_{o2})$$

Where $g_{m1}$ and $g_{m2}$ are transconductances and $r_{o1}$ and $r_{o2}$ are output impedances of transistors 211 and 212, respectively.

Cascode circuits are useful because they provide very high gain. However, cascode circuits achieve higher gains at the expense of headroom. The loss in headroom may be illustrated by first noting that both transistors 211 and 212 should remain in saturation to achieve optimum gain performance. Therefore, the minimum output voltage can be expressed as follows:

$$Vout \geq V_{GS1} - V_{TH1} + V_{GS2} - V_{TH2}$$

Where $V_{GS1}$ and $V_{GS2}$ are the gate to source voltages and $V_{TH1}$ and $V_{TH2}$ are the threshold voltages of transistors 211 and 212, respectively.

FIG. 2B shows a cascode circuit 250 including a cascode current source which limits the maximum allowable output voltage. In cascode circuit 250, the ideal current source has been replaced with a cascode current source comprising PMOS transistors 213 and 214 biased by voltages Vb2 and Vb3, respectively. A cascode current source is useful because the high output impedance associated with such structures yields a current source closer to an ideal current source. However, for optimum operation the maximum output voltage is limited as follows:

$$Vout \leq V_S - |V_{GS3} - V_{TH3}| - |V_{GS4} - V_{TH4}|$$

Where $V_{GS3}$ and $V_{GS4}$ are the gate to source voltages and $V_{TH3}$ and $V_{TH4}$ are the threshold voltages of transistors 213 and 214, respectively.

Accordingly, known cascode circuits are advantageous because they provide large gain. On the other hand, known cascode circuits are disadvantageous for low power supply applications because they have limited headroom. This limited headroom can impact the ability of the circuit to amplify currents or voltages at the output or at intermediate nodes. More particularly, at low power supply voltages, headroom limitations constrain the ability of cascode stages to drive inputs of transistors in an output stage across wide voltage ranges. These limitations result in output stages that cannot provide accurate output voltages across wide voltage ranges. What is needed is an amplifier circuit that provides high gain that can operate effectively at low power supply voltage levels.

SUMMARY

Embodiments of the present invention include amplifier circuits that may be useful for low power supply voltage applications. Amplifier circuits according to embodiments of the present invention may include a plurality of stages for processing signals. In one embodiment, the present invention provides an amplifier circuit including a cascode input stage and a differential stage having an input coupled to an output terminal of the cascode input stage. In another embodiment, a differential stage has a first input coupled to the output of a cascode transistor in the input stage, and a second input coupled to a cascode node (i.e., a node between cascaded or series connected devices).

In another embodiment, the present invention includes an amplifier having a differential stage with an output node coupled to a voltage dependent load having an impedance dependent on the voltage on the output terminal. The impedance of the load increases as the voltage on the differential stage output node increases from a negative power supply, reaches a maximum when the voltage on the differential output node is in a first voltage range between the negative power supply and a positive power supply, and decreases as the voltage on the differential output node increases toward the positive power supply.

Embodiments of the present invention may use a current mirror disclosed herein. In one embodiment, the current mirror comprises a first transistor having an current input terminal, a current output terminal, and a control terminal, a second transistor having a current input terminal, a current output terminal, and a control terminal, wherein the current input terminal of the second transistor is coupled to the current output terminal of the first transistor, a third transistor having a current input terminal, a current output terminal, and a control terminal, wherein the control terminal of the third transistor is coupled to the control terminal of the first transistor, a fourth transistor having a current input terminal, a current output terminal, and a control terminal, wherein control terminal of the fourth transistor is coupled to the control terminal of the second transistor and the current input terminal of the fourth transistor is coupled to the current output terminal of the third transistor, and a differential amplifier having a first input coupled to the current input terminal of the first transistor, a second input coupled to a node having an associated voltage approximately equal to the voltage on the current output terminal of the third transistor, and an output coupled to the control terminal of the second and fourth transistors.

The following detailed description and accompanying drawings provide a better understanding of the nature and advantages of the present invention.

BRIEF DESCRIPTION OF THE DRAWINGS

FIG. 1 illustrates a prior art amplifier circuit.

FIGS. 2A and 2B illustrate a prior art cascode stage.

DETAILED DESCRIPTION

Figure 3:
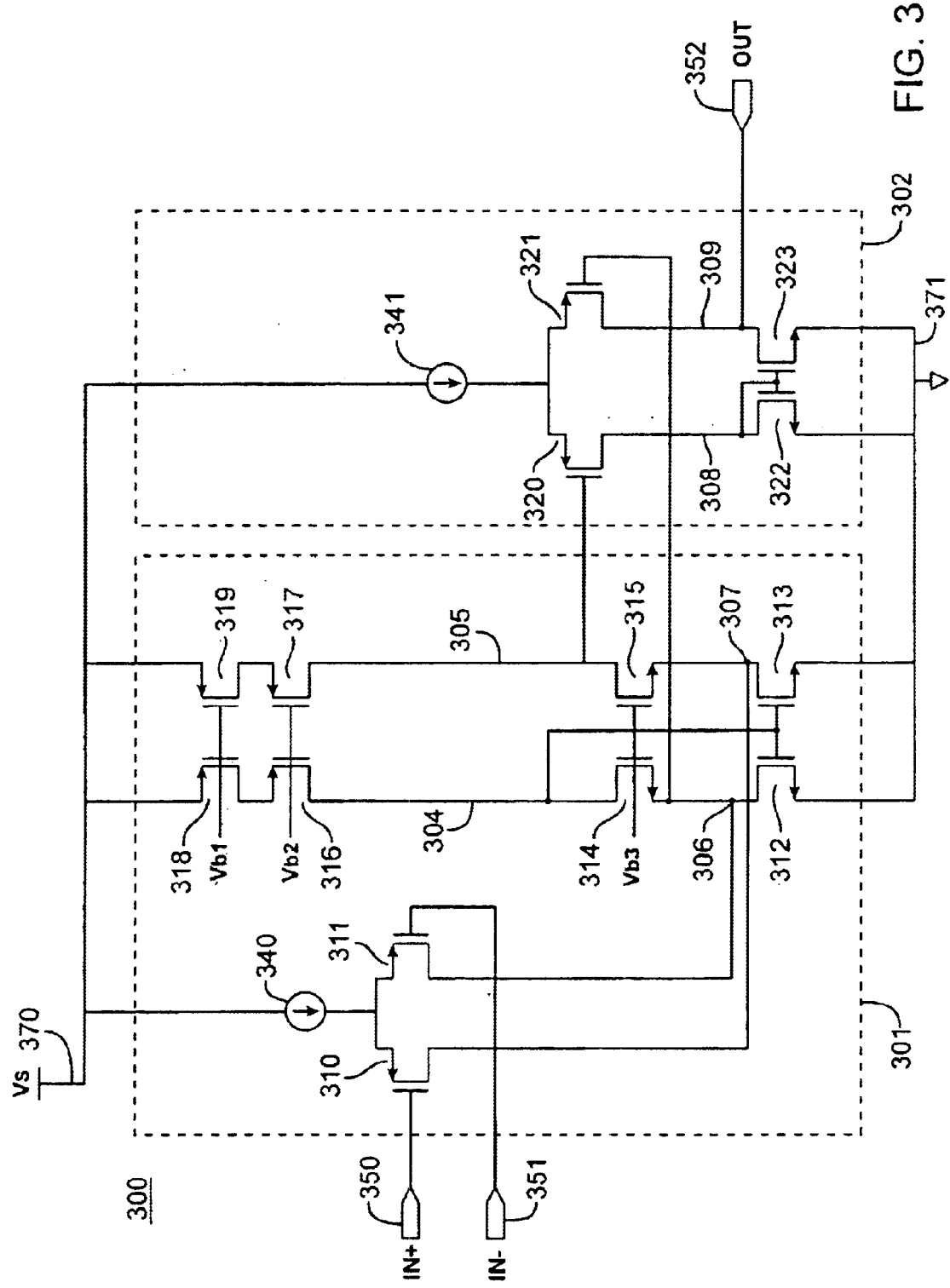
FIG. 3 illustrates two stages of an amplifier circuit according to one embodiment of the present invention.

FIG. 3 illustrates two stages of an amplifier circuit 300 according to one embodiment of the present invention. Amplifier 300 includes a cascode input stage 301 and differential stage 302 implemented in a MOS technology. The MOS transistors shown include a gate control terminal, source terminal, and drain terminal. When the circuit is operating, supply voltages are applied to power supply terminals 370 and 371. Cascode input stage 301 includes input PMOS transistors 310 and 311. The gates of PMOS transistors 310 and 311 are coupled to input terminals 350 ("IN+") and 351 ("IN−"), respectively. The sources of transistors 310 and 311 are both connected to a current source 340. Accordingly, when a differential voltage is applied across the input terminals, a differential current will be generated in the drain terminals of the PMOS transistors.

The drain of transistor 310 is coupled to cascode node 307 formed between cascaded transistor 313 and cascode transistor 315, and the drain of transistor 311 is coupled to cascode node 306 formed between cascaded NMOS transistors 312 and 314. NMOS transistors 312 and 313 function as active loads for the cascode stage. The sources of transistors 312 and 313 are coupled to a low supply potential 371 (e.g., ground), and their gates are connected together. Additionally, a bias voltage Vb3 is connected to the gates of transistors 314 and 315. In one exemplary embodiment particularly suited for low voltage applications, the gates of NMOS transistors 312 and 313 may be connected to the drain of transistor 314, and bias voltage Vb3 may be set at a voltage level such that transistors 314 and 315 are in saturation and transistors 312 and 313 are on the border of the saturation-triode regions of operation (i.e., Vds is very close Vdsat).

Transistors 312–315 receive substantially equal currents at nodes 304 and 305 from a cascode current source comprising PMOS transistors 316–319. The gates of PMOS transistors 318 and 319 are both connected to bias voltage Vb1, and the gates of PMOS transistors 316 and 317 are both connected to a bias voltage Vb2. The sources of transistors 318 and 319 are connected to power supply terminal 370 ("Vs"), and the drains of transistors 318 and 319 are connected to the sources of transistors 316 and 317, respectively. The drains of transistors 316 and 317 are high impedance outputs of the cascode current source. If the dimensions of transistors 318 and 316 are equal to the dimensions of transistors 319 and 317, respectively, then the cascode current source generates substantially equal currents from the drains of transistors 316 and 317 into nodes 304 and 305. Accordingly, when the input terminals 350 and 351 are at equal voltages, the current through transistor 312 is equal to one-half the current through current source 340 plus the drain current of transistor 316. Likewise, the current through transistor 313 is equal to one-half the current provided by current source 340 plus the drain current of transistor 317. When a differential voltage is applied to the input terminals, a differential current is generated by transistors 310 and 311 into cascode nodes 306 and 307. This differential current produces a change in voltage at node 305, the output of the cascode input stage.

Those skilled in the art will recognized that transistors 310–315 are configured within amplifier circuit 300 in a "folded cascode" configuration. A folded cascode configuration is shown here only as one example of the present invention. Those skilled in the art will understand that the features and advantages of the present invention can be used in other amplifier circuit configurations.

Output node 305 of input stage 301 is coupled to an input of differential stage 302. FIG. 3 illustrates a differential stage according to one embodiment of the present invention. Differential stage 302 in amplifier 300 may include PMOS differential input transistors 320 and 321 and NMOS load transistors 322 and 323. The gate of transistor 320 is coupled to node 305 for receiving the output of input stage 301. Additionally, the gate of transistor 321 is coupled to the cascode node 306. The sources of PMOS transistors 320 and 321 are both connected to current source 341, and the drains of PMOS transistors 320 and 321 are connected to the drains of NMOS load transistors 322 and 323, respectively. NMOS load transistors 322 and 323 are configured as a current mirror. Accordingly, the gates of transistors 322 and 323 are connected together and further connected to the drain of transistor 322 at node 308. The output 352 of differential stage 302 may be taken from the drain of transistor 323 at node 309.

As mentioned previously, low power supply voltage levels constrain the performance of amplifiers in a number of ways. In particular, there is a limited voltage budget that each stacked device may consume across intermediate nodes between the negative supply and positive supply. Low power supply voltage-induced constraints are compounded by the desire to increase the bias voltages on particular devices to minimize non-idealities such as noise and offsets. To address low power supply-induced limitations, one embodiment of the present invention utilizes an induced (i.e., designed-in) offset voltage in differential stage 302 to control the operating points of transistors in the preceding stages. For example, differential stage 302 may be designed to include an inherent offset voltage. In one embodiment, an offset voltage may be induced by intentionally mismatching the parameters of transistors in the gain stage (e.g., intentionally designing the gain stage transistors to have different physical characteristics). For example, transistors 320 and 321 may have different width to length ratios ("W/L"). Of course, it is to be understood that other techniques of inducing an offset may also be used. A resistive element could be coupled to the source of an input transistor, for example.

When amplifier 300 is in a closed loop configuration, the offset voltage will appear as a voltage difference between the gate voltages of input transistors 320 and 321. This voltage may be used to set the operating point of transistors in the input stage. For example, in one embodiment, the input of transistor 321 is coupled to cascode node 306 to control the operating point of transistor 315. The voltage on cascode node 306 is approximately equal to the voltage on cascode node 307 because both cascode nodes are a Vgs below bias voltage Vb3, and moreover, because the gates and sources of transistors 312 and 313 are connected together (i.e., the drain currents are equal). In this configuration, the drain to source voltage of cascode transistor 315 may be controlled by the offset of differential stage 302. In other words, the induced voltage difference between the inputs of the differential stage 302 controls the voltage difference between the drain and source of cascode transistor 315.

Other embodiments of the present invention may couple the input of transistor 321 to other nodes having associated voltages approximately equal to the source voltage of cascode transistor 315. In particular, alternate embodiments where the input of transistor 321 is coupled to a voltage a Vgs below the voltage on the gate of transistor 315 may be used. For example, the gate of transistor 321 may be coupled to a bias circuit including a transistor having a gate coupled to the gate of cascode transistor 315, wherein the Vgs of the bias circuit transistor is approximately equal to the Vgs of cascode transistor 315. In one embodiment, the gate of transistor 321 may be coupled directly to the source of cascode transistor 315.

In some embodiments of the present invention it may be desirable to use weak devices (i.e., devices where $g_m$ is intentionally lowered relative to other devices in the circuit) for transistors 312 and 313 in order to reduce deleterious noise and offset voltages. In such instances, the voltages at nodes 306 and 307 should be high enough to bias the devices into saturation. Therefore, it is desirable to minimize the bias values of other devices in the cascode stage to accommodate lower supply voltages. In one embodiment of the present invention, the differential stage is designed to generate an offset voltage across the inputs so that transistor 315 operates in saturation very close to the triode region (i.e., very close to Vdsat). Accordingly, the voltage drop between the drain and source of transistor 315 can be minimized, thereby further increasing the headroom of input stage 301.

For example, in one embodiment using a 2.3V supply and weak transistors 312 and 313, nodes 306 and 307 are biased at approximately 800 mV. Additionally, an offset voltage of approximately 200 mV is introduced in the inputs of the differential stage. Accordingly, when amplifier 300 is in a closed loop configuration, this voltage is established between the drain of transistor 315 and cascode node 306. As a result, the drain to source voltage of transistor 315 is approximately 200 mV, which is very close to Vdsat (i.e., just above the edge of the saturation-triode boundary). Of course, while the above example illustrates the advantages of various aspects of the present invention, it is to be understood that other voltages and transistor configurations could also be used that embody the concepts described herein.

Features and advantages of the present invention include generating an offset voltage in a first stage that tracks changes in the characteristics of devices in prior stages, and using the offset voltage to tightly control the bias of devices in the prior stages as the characteristics of the devices change. For example, one particular advantage of amplifier 300 is that the offset voltage generated by differential stage 302 will track changes in Vdsat of transistor 315 caused by process variations or temperature variations. Generally, the variation in Vdsat with process and temperature would require that the voltage between the drain and source of transistor 315 be sufficiently large to ensure that the transistor does not inadvertently enter the triode region as a result of process or temperature changes. The extra voltage required to ensure that a device remains in saturation across changing process and temperature may be referred to as a margin voltage, or just margin. However, both Vdsat and the input offset voltage of input transistors 320 and 321 have a positive temperature coefficient. Additionally, Vdsat and the offset voltage will track across process. Therefore, because these parameters track, a differential stage offset voltage very close to the value of Vdsat can be introduced for controlling transistor 315, and less margin is required. Accordingly, this technique translates into a larger headroom for the output of input stage 301.

Figure 4:
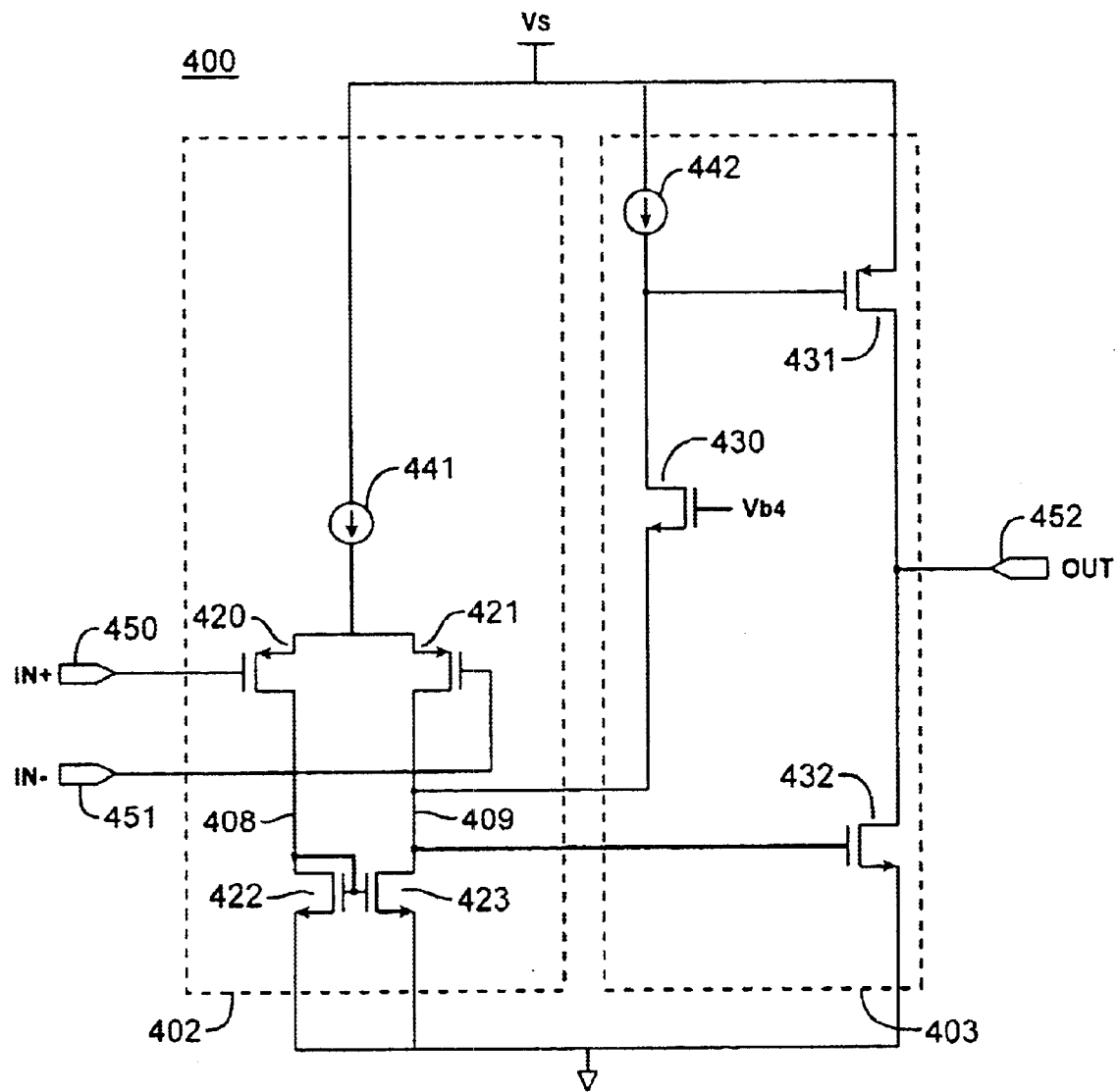
FIG. 4 illustrates two stages of an amplifier circuit according to another embodiment of the present invention.

FIG. 4 illustrates two stages of an amplifier circuit 400 according to another embodiment of the present invention. Amplifier 400 includes a differential stage 402 and output stage 403. Differential stage 402 includes PMOS differential input transistors 420 and 421 and an active load comprising NMOS load transistors 422 and 423. The gate of transistor 420 is coupled to input node 450 and the gate of transistor 421 is coupled to input node 451. The sources of PMOS transistors 420 and 421 receive a differential stage bias current from current source 441. Additionally, the drains of PMOS transistors 420 and 421 are connected to the drains of NMOS load transistors 422 and 423, respectively. NMOS load transistors 422 and 423 are configured as a current mirror. Accordingly, the gates of transistors 422 and 423 are connected together and further connected to the drain of transistor 422 at node 408. The output of differential stage 402 may be taken from the drain of transistor 423 at node 409.

Embodiments of the present invention may include a differential stage 402 coupled to a common gate stage (or common base stage if implemented in bipolar) having an input impedance dependent on the differential stage output voltage. Together, the differential stage and common base stage operate to reduce the output impedance, and hence the gain, of the differential stage as the voltage on output node 409 approaches either the positive or negative supplies.

In one embodiment, output node 409 of differential stage 402 is coupled to a common gate stage comprising an NMOS transistor 430. The input impedance of a common gate stage is approximately given by the following equation:

$$R_{in} = 1/g_m$$

On the other hand, $g_m$ is approximately given by the following equations:

$$g_m(\text{sat}) = \mu_o C_{ox}(W/L)(V_{gs} - V_{th}); \text{ and}$$

$$g_m(\text{triode}) = = \mu_o C_{ox}(W/L) V_{ds}$$

When the voltage on output node 409 of differential stage 402 is at the lower supply, the input impedance of the common gate stage is low and dominates the output impedance of the differential stage 402. The gain of differential stage 402 is approximately given by the following:

$$A_v = G_m R_o$$

Where $G_m$ is the total transconductance of the differential stage, and $R_o$ is the combined output impedance of the differential stage and the common gate stage. Accordingly, when the voltage on node 409 is near the negative supply, the composite gain is reduced.

As the voltage on output node 409 of differential stage 402 increases, $g_m$ of the common gate stage will decrease, and the input impedance of common gate stage 430 will increase. Consequently, as the voltage on output node 409 moves away from the negative supply, $R_o$ will increase because the input impedance of the common gate stage increases. Therefore, the gain of differential stage 402 will increase. However, as the voltage on output node 409 approaches the positive supply, transistor 421 will enter the triode region of operation. Consequently, the output impedance of the differential stage will decrease, thereby reducing the gain of the differential stage at the positive supply.

The embodiment shown in FIG. 4 illustrates one advantageous application of the above described technique. An output stage 403 including a common gate stage is coupled to receive the output of differential stage 402. In the present embodiment, the output of differential stage 402 is coupled to the gate of NMOS output transistor 432 and to the source of common gate NMOS transistor 430. The gate of transistor 430 is coupled to a bias voltage Vb4, and the drain is coupled to both the gate of PMOS output transistor 431 and bias current source 442. In this configuration, the output of differential stage 402 is coupled to the gates of both PMOS transistor 431 and NMOS transistor 432 to generate an output at terminal 452 ("OUT"). When the differential stage output voltage decreases, the drain current of PMOS transistor 431 increases and the drain current of NMOS transistor 432 decreases. Accordingly, the voltage on output terminal 452 will increase. On the other hand, when the differential stage output voltage increases, the drain current of NMOS transistor 432 increases and the drain current of PMOS transistor 431 decreases. Accordingly, the voltage on output terminal 452 will decrease.

The technique discussed above is especially advantageous for low voltage supply applications because many prior low voltage circuits cannot drive the gates of the output devices maximally. For example, in a circuit which uses an NMOS source follower to drive the gate of the NMOS output transistor, the output transistor gate cannot rise above $V_{CC} - V_{GS}$. This severely constrains the current-carrying capability of the output device at low supply voltages. However, according to the embodiments of the present invention, the voltage at the input of NMOS transistor 432 can increase all the way to the supply voltage, and the transistor can thereby sink current more effectively.

Embodiments of the invention may include a first transistor in the active load that is sized to receive a first portion of the bias current from current source 441, and a second transistor in the active load sized to receive a second portion of the bias current in addition to the bias current of the common base stage. For example, load transistors 422 and 423 may be dimensioned differently in order to enhance interoperability between differential stage 402 and output stage 403. Each transistor 422 and 423 may have a drain current equal to one-half the current provided by current source 441. However, transistor 423 may be dimensioned such that its drain current is equal to the combination of one-half the current from source 441, and additionally, the bias current received from the source of common gate transistor 430.

Figure 5:
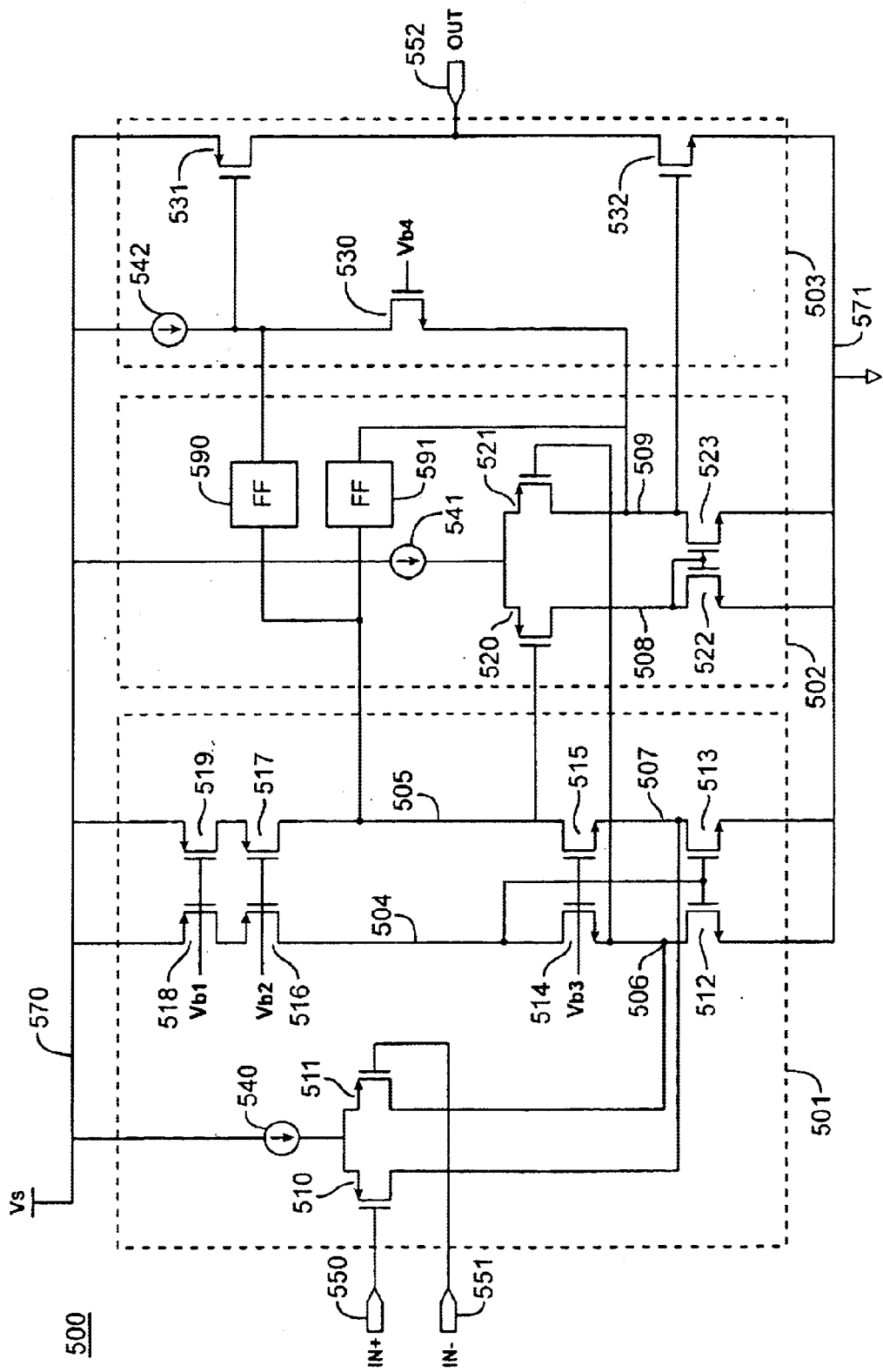
FIG. 5 illustrates an amplifier circuit according to another embodiment of the present invention.

FIG. 5 illustrates an amplifier circuit 500 that may incorporate the above described techniques according to another embodiment of the present invention. Amplifier 500 includes a cascode input stage 501, differential stage 502, and output stage 503. Cascode input stage 501 includes input PMOS transistors 510 and 511. The gates of PMOS transistors 510 and 511 are coupled to input terminals 550 ("IN+") and 551 ("IN−"), respectively. The sources of transistors 510 and 511 are both connected to bias current source 540. When a differential voltage is applied across the input terminals, a differential current will be generated into cascode nodes 506 and 507. This current will result in an amplified output voltage at node 505 as a result of the action of NMOS transistors 512–515 and PMOS transistors 516–519.

A first input of differential stage 502 is coupled to node 505 for receiving the output of cascode input stage 501, and a second input of differential stage 502 may be coupled to cascode node 506 or any other node having a voltage approximately equal to the source voltage of cascode transistor 515 for controlling the bias of transistor 515. Differential stage 502 may include an offset voltage for biasing transistor 515 very close to the saturation-triode region boundary. Differential stage 502 comprises differential input transistors 520 and 521 and NMOS load transistors 522 and 523. The sources of PMOS transistors 520 and 521 are both connected to bias current source 541, and the drains of PMOS transistors 520 and 521 are connected to the drains of NMOS load transistors 522 and 523, respectively. The output of differential stage 502 may be taken from the drain of transistor 523 at node 509.

Output stage 503 of amplifier 500 is coupled to receive the output of differential stage 502. The output of differential stage 502 is coupled to the gate of NMOS output transistor 532 and to the source of NMOS transistor 530, which is configured as a common gate stage. The gate of transistor 530 is coupled to a bias voltage Vb4, and the drain is coupled to both the gate of PMOS output transistor 531 and bias current source 542. Finally, the drain terminals of both PMOS transistor 531 and NMOS transistor 532 are coupled to output terminal 552.

Embodiments of amplifier 500 may also include compensation circuits such as feed forward circuits ("FF") 590 and 591. Feed forward circuit 590 may be coupled between the cascode stage output node 505 and the gate of PMOS transistor 531. Feed forward circuit 591 may be coupled between cascode stage output node 505 and the output of gain stage 502 at node 509. Feed forward circuits 590 and 591 may be included to stabilize amplifier 500 by allowing high frequency signal components to bypass delay elements in the circuit, thereby preserving phase margin.

Amplifier 500 is capable of providing high gain at low power supply voltages. Amplifier 500 also improves the amplifier's current sinking ability via NMOS transistor 532 over prior art techniques. For example, if a large negative differential input is applied to terminals 550 and 551, the output of differential stage 502 will drive node 509, and the gate of NMOS transistor 532, toward the power supply terminal 570 ("Vs"). As the voltage on node 509 increases from the negative supply terminal, the gain of the differential pair will increase because the input impedance of transistor 530 will increase. As a result, the increase in composite gain of stages 501 and 502 will increase the gate drive to transistor 532.

Moreover, as the differential input is further increased into the extreme range of operation, both the source and drain voltages of transistor 521 will become greater than the gate voltage of transistor 521. Therefore, Vds approaches zero and transistor 521 will enter the deep triode region of operation. Accordingly, node 509 and the gate of transistor 532 will rise to a maximum voltage of:

$$V_{509\_max} = V_S - V_{DSAT},$$

where $V_{DSAT}$ is the minimum voltage drop of current source 541, which may be the drain to source saturation voltage for a current carrying transistor in current source 541. Additionally, the output of the cascode stage will rise to:

$$V_{505\_max} = V_S - V_{DSAT} - V_{GS},$$

where $V_{DSAT}$ is again typically the drain to source saturation voltage for the current carrying transistor in current source 541, and $V_{GS}$ is the gate to source voltage of transistor 520. Therefore, at the extreme range of operation the gate of NMOS transistor 532 is driven by a source follower comprising PMOS transistor 520 and current source 541. Accordingly, because output node 505 of cascode input stage 501 does not have to rise all the way to the power supply voltage Vs, the input stage retains more gain across a wider range of operation. At extreme voltage ranges, this additional gain can be coupled though source follower transistor 520 to drive the gate of NMOS transistor 532. This results in an improved ability to sink currents at low power supply voltages.

Figure 6:
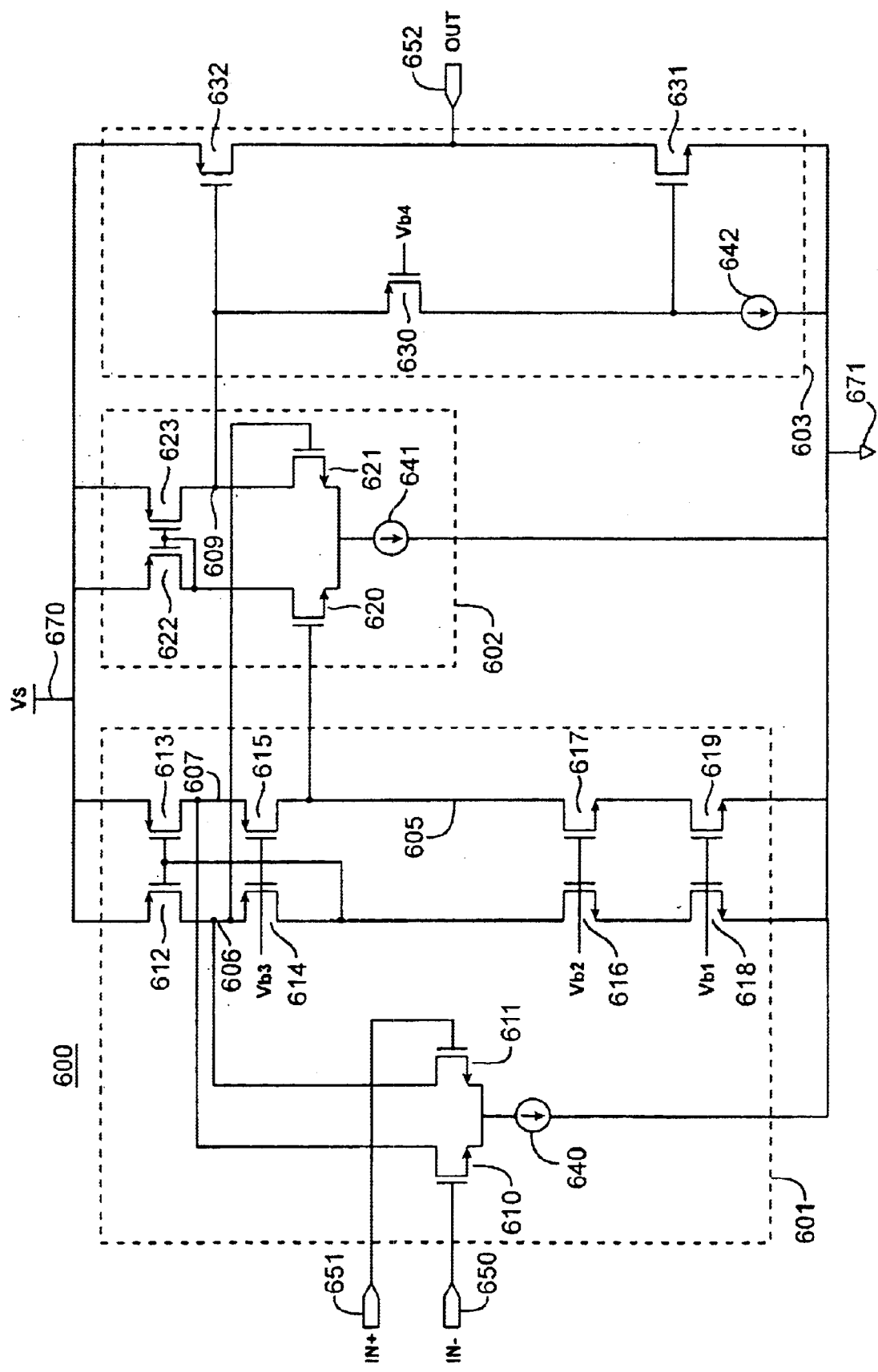
FIG. 6 illustrates an amplifier circuit according to another embodiment of the present invention.

FIG. 6 illustrates an amplifier circuit 600 that may incorporate the above described techniques according to another embodiment of the present invention. Amplifier 600 also includes a cascode input stage 601, differential stage 602, and output stage 603. Cascode input stage 601 includes input NMOS transistors 610 and 611. The gates of NMOS transistors 610 and 611 are coupled to input terminals 650 ("IN+") and 651 ("IN−"), respectively. The sources of transistors 610 and 611 are both connected to bias current source 640. When a differential voltage is applied across the input terminals, a differential current will be generated into cascode nodes 606 and 607. This current will result in an amplified output voltage at node 605 as a result of the action of PMOS transistors 612–615 and NMOS transistors 616–619. Those skilled in the art will recognized that transistors 610–615 are configured within amplifier circuit 600 in a "folded cascode" configuration.

A first input of differential stage 602 is coupled to node 605 for receiving the output of cascode input stage 601, and a second input of differential stage 602 is coupled to cascode node 606 for controlling the bias of transistor 615. Differential stage 602 may include an offset voltage for biasing transistor 615 very close to the saturation-triode region boundary. Differential stage 602 comprises differential NMOS input transistors 620 and 621 and PMOS load transistors 622 and 623. The sources of NMOS transistors 620 and 621 are both connected to bias current source 641, and the drains of NMOS transistors 620 and 621 are connected to the drains of PMOS load transistors 622 and 623, respectively. The output of differential stage 602 may be taken from the drain of transistor 623 at node 609.

Output stage 603 of amplifier 600 is coupled to receive the output of differential stage 602. The output of differential stage 602 is coupled to the gate of PMOS output transistor 632 and to the source of PMOS transistor 630, which is configured as a common gate stage. The gate of transistor 630 is coupled to a bias voltage Vb4, and the drain is coupled to both the gate of NMOS output transistor 631 and bias current source 642. Finally, the drain terminals of both NMOS transistor 631 and PMOS transistor 632 are coupled to output terminal 652.

Figure 7:
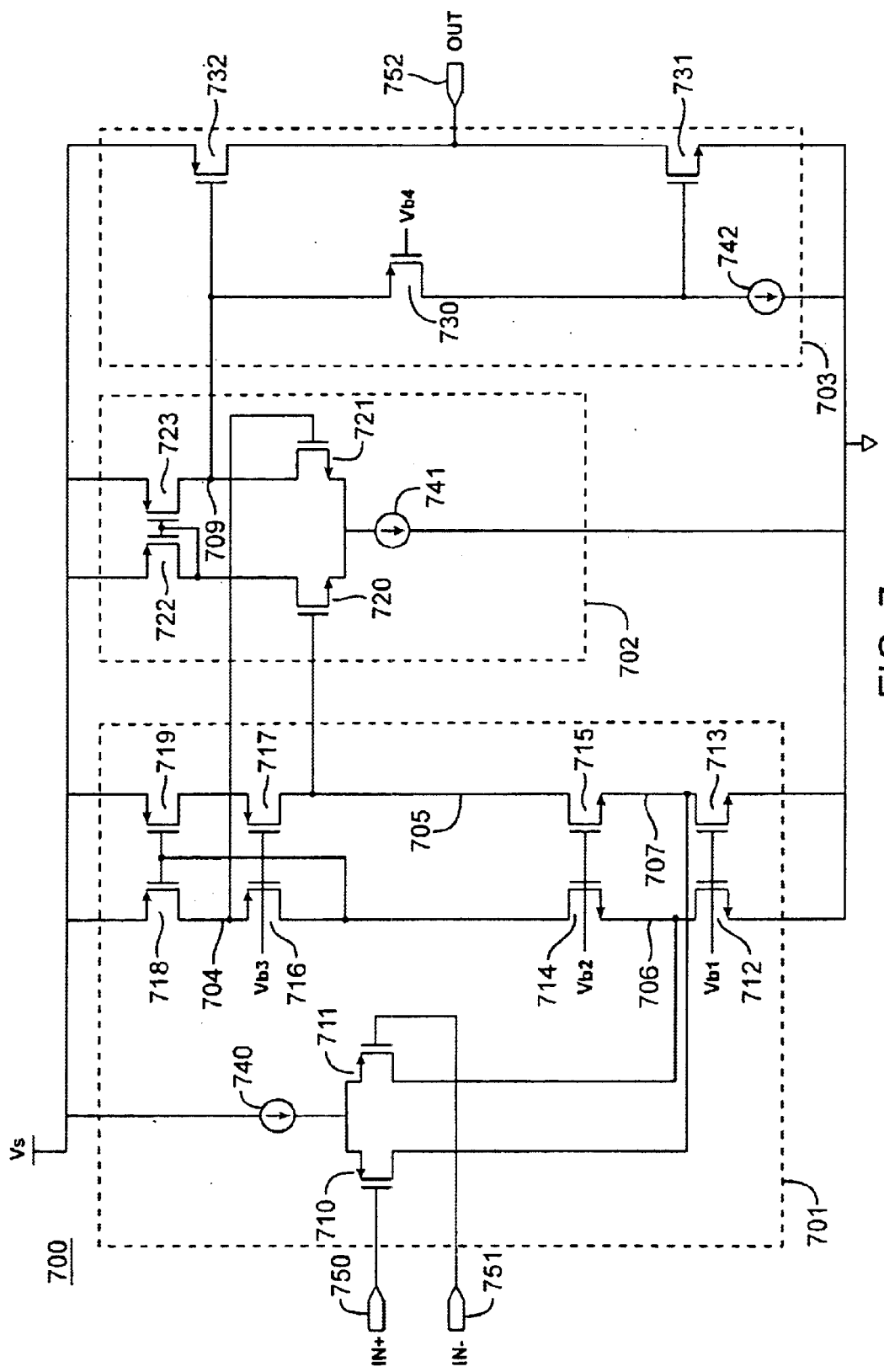
FIG. 7 illustrates an amplifier circuit according to yet another embodiment of the present invention.

FIG. 7 illustrates an amplifier circuit 700 that may incorporate the above described techniques according to another embodiment of the present invention. Amplifier 700 also includes a cascode input stage 701, differential stage 702, and output stage 703. Cascode input stage 701 includes input PMOS transistors 710 and 711. The gates of PMOS transistors 710 and 711 are coupled to input terminals 750 ("IN+") and 751 ("IN−"), respectively. The sources of transistors 710 and 711 are both connected to bias current source 740. When a differential voltage is applied across the input terminals, a differential current will be generated into cascode nodes 706 and 707. This current will result in an amplified output voltage at node 705 as a result of the action of NMOS transistors 712–715 and PMOS transistors 716–719. Those skilled in the art will recognized that transistors 710–715 are configured within amplifier circuit 700 in a "folded cascode" configuration.

A first input of differential stage 702 is coupled to node 705 for receiving the output of cascode input stage 701, and a second input of differential stage 702 is coupled to cascode node 704 for controlling the bias of transistor 717. Differential stage 702 may include an offset voltage for biasing transistor 717 very close to the saturation-triode region boundary. Differential stage 702 comprises differential NMOS input transistors 720 and 721 and PMOS load transistors 722 and 723. The sources of NMOS transistors 720 and 721 are both connected to bias current source 741, and the drains of NMOS transistors 720 and 721 are connected to the drains of PMOS load transistors 722 and 723, respectively. The output of differential stage 702 may be taken from the drain of transistor 723 at node 709.

Output stage 703 of amplifier 700 is coupled to receive the output of differential stage 702. The output of differential stage 702 is coupled to the gate of PMOS output transistor 732 and to the source of PMOS transistor 730, which is configured as a common gate stage. The gate of transistor 730 is coupled to a bias voltage Vb4, and the drain is coupled to both the gate of NMOS output transistor 731 and bias current source 742. Finally, the drain terminals of both NMOS transistor 731 and PMOS transistor 732 are coupled to output terminal 752.

Figure 8:
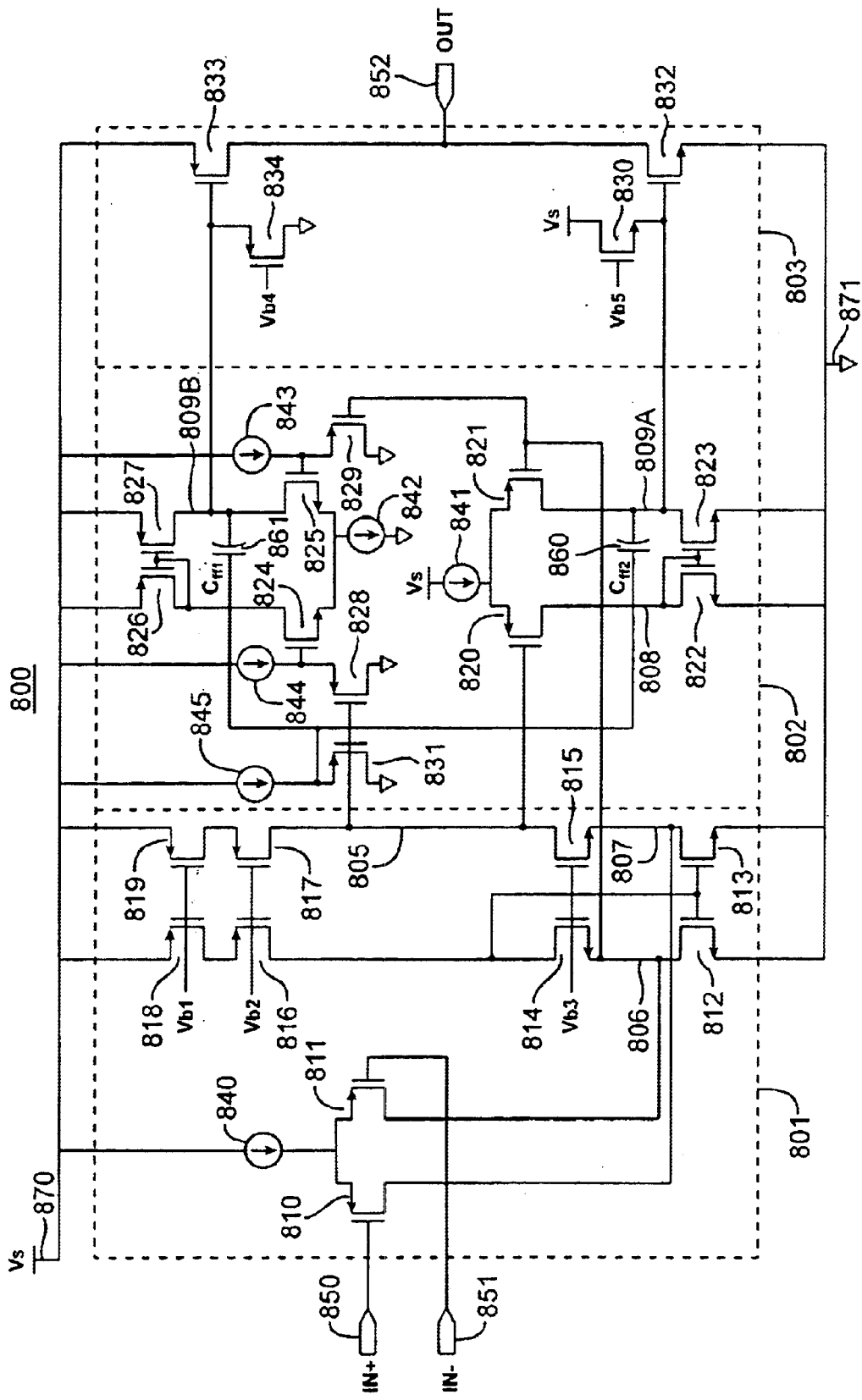
FIG. 8 illustrates an amplifier circuit including a second stage according to another embodiment of the present invention.

FIG. 8 illustrates an amplifier circuit 800 according to yet another embodiment of the present invention. Amplifier 800 includes a cascode input stage 801, gain stage 802, and output stage 803. Cascode input stage 801 includes input PMOS transistors 810 and 811 and bias current source 840. The gates of PMOS transistors 810 and 811 are coupled to input terminals 850 ("IN+") and 851 ("IN−"), respectively, and the sources of transistors 810 and 811 are both connected to bias current source 840. Cascode input stage 801 also includes NMOS transistors 812–815 and PMOS transistors 816–819 for generating an amplified output voltage at node 805 in response to a differential input voltage on terminals 850 and 851. The drains of transistors 810 and 811 are coupled to cascode nodes 807 and 806, respectively.

Gain stage 802 is coupled to node 805 to receive the output of cascode input stage 801. Gain stage 802 includes first and second complementary differential stages for generating a differential output at nodes 809A and 809B. Gain stage 802 may also include an offset voltage for biasing transistor 815 very close to the saturation-triode region boundary. Additionally, amplifier 800 may further include a feed forward circuit for providing a portion of the signal from the output of cascode input stage 801 to output stage 803.

The first differential stage comprises transistors 820–823. The gate of PMOS transistor 820 is coupled to the cascode output node 805, and the gate of PMOS transistor 821 is coupled to cascode node 806. The sources of PMOS transistors 820 and 821 are both connected to bias current source 841, and the drains of PMOS transistors 820 and 821 are connected to the drains of NMOS load transistors 822 and 823, respectively. A first output of differential stage 802 is produced at node 809A.

A second differential stage comprising transistors 824–829 is also included in gain stage 802 for providing a complementary output at node 809B. The gates of PMOS transistors 828 and 829 are coupled to the cascode output node 805 and cascode node 806, respectively. The sources of PMOS transistors 828 and 829 are coupled to bias current sources 844 and 843, respectively. These transistors provide level shifting of the input signals received from cascode input stage 801. The gates of NMOS transistors 824 and 825 are coupled to the sources of the level shift devices 828 and 829 for receiving the input signals to be amplified. The sources of transistors 824 and 825 are both coupled to bias current source 842, and the drains of transistors 824 and 825 are coupled to an active load comprising PMOS load transistors 826 and 827. A second output of gain stage 802 is produced at node 809B.

In one embodiment, both the first and second differential stages include a designed-in offset voltage for setting the operating points of transistors in the cascode input stage. For example, the second differential stage may have an offset which matches the offset of the first differential stage. P-channel transistors 828 and 829 may be designed so that the current densities match the current densities of N-channel transistors 820 and 821, respectively. In this way the offsets of the first and second differential stages are produced by the same type of devices, which may be laid out such that the geometries match (828 with 820, and 829 with 821). Furthermore, as the offset of the first differential stage varies due to process and temperature variations, the offset of the second differential stage will track the first. The feature is beneficial because it minimizes variability in the quiescent current of the output stage as these parameters vary. In this topology, the first and second differential stages share responsibility for biasing the cascode transistor 815.

As previously mentioned, amplifier 800 may also include a feed forward circuit for providing a portion of the signal from the output of cascode input stage 801 to the input of output stage 803. The feed forward circuit includes PMOS transistor 831, bias current source 845, and feed forward capacitors 860 ("$C_{ff2}$") and 861 ("$C_{ff1}$"). The gate of PMOS transistor 831 is coupled to the cascode output node 805. Additionally, the source of PMOS transistor 831 is coupled to bias current source 845 so that the combination will act as a source follower. Feed forward capacitors 860 and 861 are coupled between the source of PMOS transistor 831 and the gates of output transistors 832 and 833, respectively. The capacitance values of feed forward capacitors 860 and 861 may be selected to stabilize the circuit by bypassing delay elements in the circuit at high frequencies.

Output stage 803 of amplifier 800 is coupled to receive the outputs of the differential amplifiers in gain stage 802. Also coupled to the outputs of the differential amplifiers are common gate devices 830 and 834. Thus, the drain of transistor 821 is coupled to the gate of NMOS output transistor 832, and the drain of transistor 825 is coupled to the gate of PMOS output transistor 833. The gate of NMOS transistor 830 is coupled to a bias voltage Vb5, and the source of transistor 830 is coupled to the gate of NMOS output transistor 832 and to node 809A. Similarly, the gate of PMOS transistor 834 is coupled to a bias voltage Vb4, and the source of transistor 834 is coupled to the gate of PMOS output transistor 833 and to node 809B. Finally, the drain terminals of both PMOS transistor 833 and NMOS transistor 832 are coupled to output terminal 852.

Figure 9A:
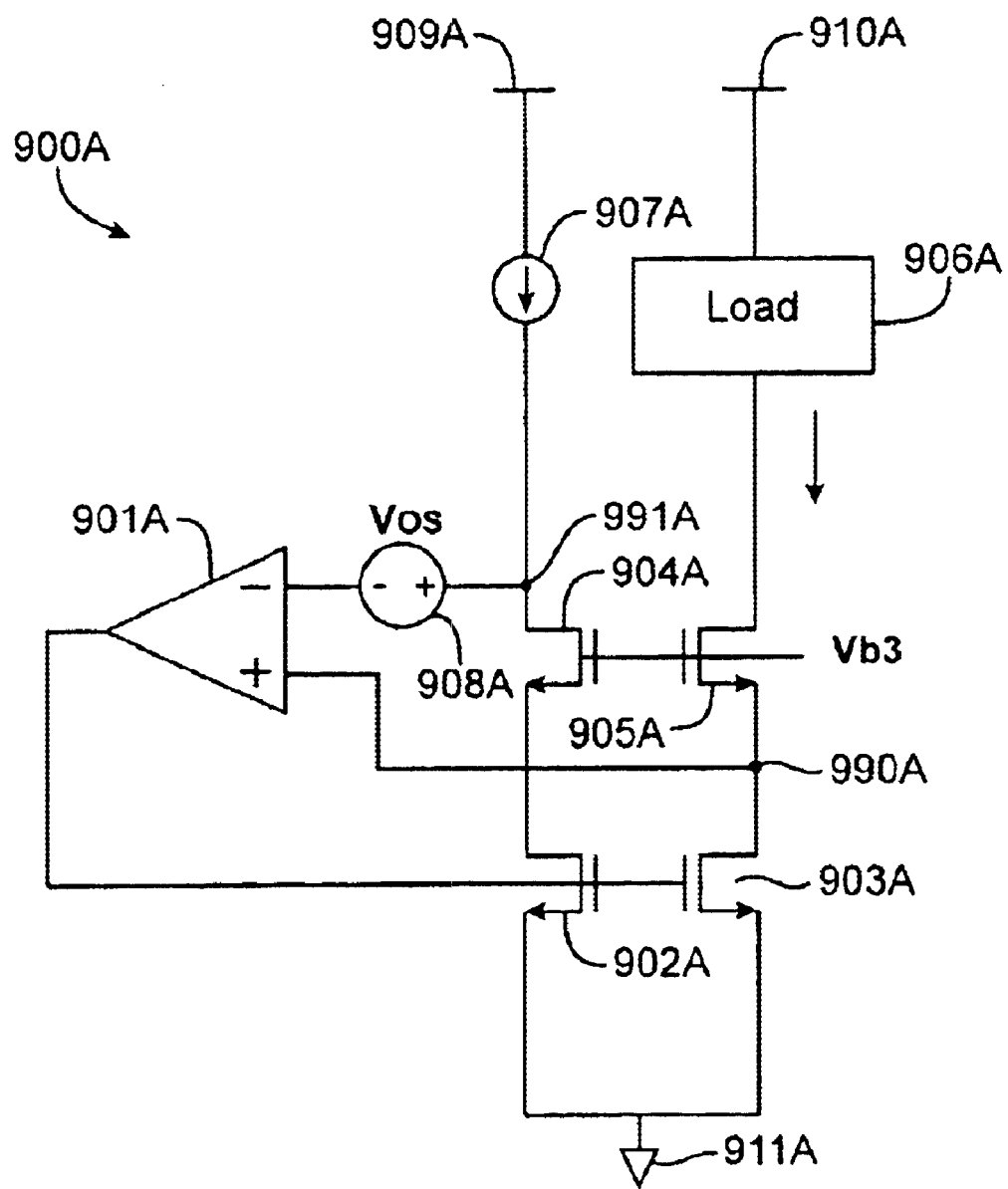
FIG. 9A illustrates a current mirror that may be used in embodiments of the present invention.

FIG. 9A illustrates a current mirror 900A that may be used in embodiments of the present invention. The performance of a current mirror may be improved by coupling the inputs of a differential amplifier 901A to nodes of the current mirror, and thereby use the amplifier to control the behavior of the current mirrors transistors. Current mirror 900A may be used as a low-voltage current mirror with high output impedance and improved input headroom. The current mirror 900A illustrated in FIG. 9A may be used in many applications. While current mirror 900A may be beneficially used in embodiments of the amplifier circuits disclosed herein, current mirror 900A is not limited to amplifier applications.

In one embodiment, current mirror 900A includes a transistor 902A having a source coupled to a negative supply voltage (e.g., ground) and a drain coupled to the source of a cascode transistor 904A. Similarly, transistor 903A has a source coupled to the negative supply and a drain coupled to the source of another cascode transistor 905A. The gate of transistor 902A is coupled to the gate of transistor 903A, and the gate of transistor 904A is coupled to the gate of transistor 905A. The gates of transistors 904A and 905A are coupled to a bias voltage Vb3. A current source 907A is coupled to the drain of transistor 904A, and a load 906A is coupled to the drain of transistor 905A. Current mirror 900A includes a differential amplifier 901A having a first input 991A coupled to the drain of transistor 904A and a second input 990A coupled to the source of transistor 905A.

An offset voltage 908A is included to control the voltage difference between the differential amplifier inputs 990A and 991A. The feedback action of differential amplifier 901A maintains the first input node 991A at an approximately fixed voltage above the second input node 990A. The voltage difference between the input nodes 990A and 991A is equal to the designed-in offset voltage 908A, which may be advantageously set to bias transistor 904A on the edge of the saturation region of operation.

During operation, current mirror 900A is coupled between a positive supply 909A and a negative supply 911A. Current from current source 907A flows into the drain terminal of transistor 904A and out of the source terminal. Current from the source terminal of transistor 904A flows into the drain terminal of transistor 902A. Current from the load 906A flows into the drain terminal of transistor 905A and out of the source terminal. Current from the source terminal of transistor 905A flows into the drain of transistor 903A. Amplifier 901A is in a closed loop because the output is coupled to the control terminals of transistors 902A and 903A, which control the current in the mirror. Feedback action will maintain a voltage difference between the amplifier input terminals that is approximately equal to the designed-in offset voltage. Thus, embodiments of the present invention allow the current in transistors 902A and 903A to be controlled to maintain the cascode device 904A on the edge of the saturation region of operation, thereby improving the input headroom of the circuit. In particular, the voltage at input node 991A need not exceed $2V_{DSAT}$ plus a small margin.

Current mirror 900A may be implemented in different technologies. While current mirror 900A is shown in FIG. 9A as comprising NMOS transistors, it is to be understood that opposite polarity PMOS devices could be substituted. Alternatively, current mirror 900A may be implemented in bipolar by substituting NPN or PNP devices. In a bipolar implementation, base currents would advantageously cancel. Moreover, a bipolar implementation would have high accuracy and high output impedance together with wide output swing and improved input headroom.

Figure 9C:
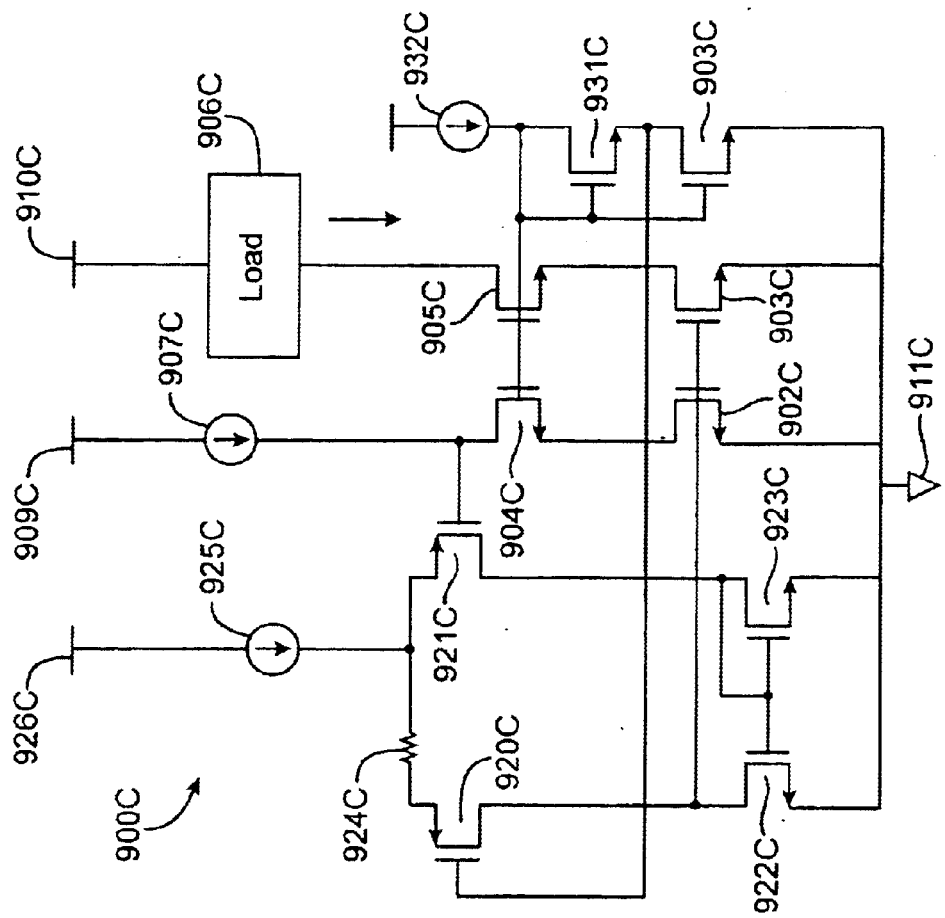
FIGS. 9B and 9C illustrate other embodiments of the current mirror of FIG. 9A.
Figure 9B:
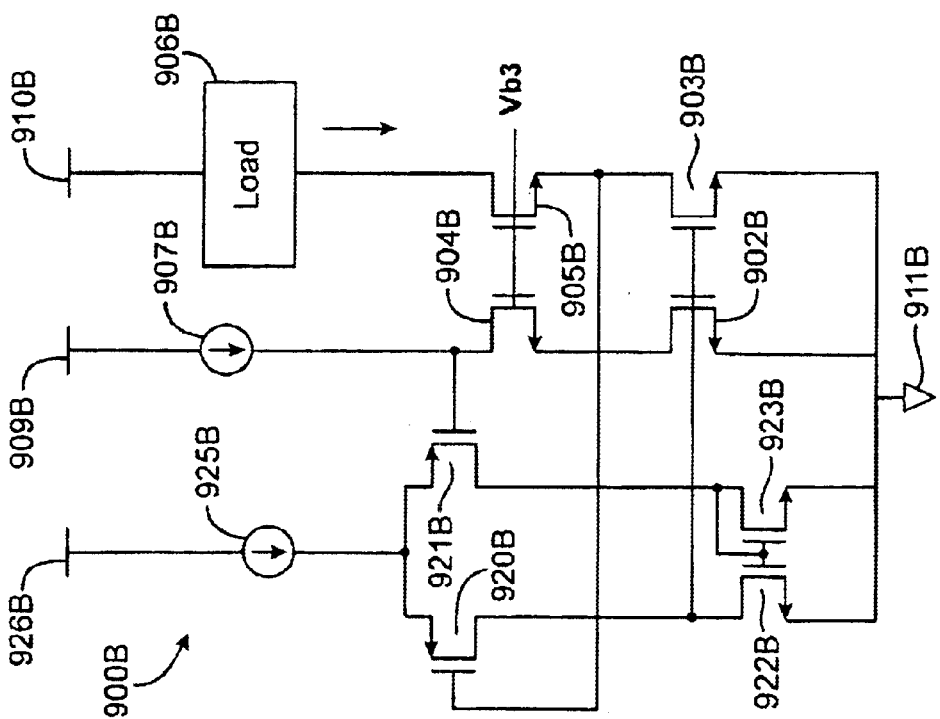

FIGS. 9B and 9C illustrate other embodiments of the current mirror of FIG. 9A. Current mirror 900B of FIG. 9B illustrates the circuit for amplifier 901A of FIG. 9A according to one embodiment of the present invention. The differential amplifier in current mirror 900B includes a differential pair comprising transistors 920B and 921B and an active load comprising transistors 922B and 923B. The source terminals of differential transistors 920B and 921B are coupled together and to current source 925B. In a MOS implementation, the offset voltage may be achieved by mismatching the width to length ratios of transistors 920B and 921B.

FIG. 9C illustrates another embodiment of the current mirror circuit. The first input of the differential amplifier is coupled to the drain terminal of transistor 904C and the second input of the differential amplifier is coupled to a node having an associated voltage approximately equal to the voltage on the source terminal of transistor 905C. For example, in current mirror 900C, the second input to the differential amplifier is coupled to a voltage generated by a bias circuit. The bias circuit includes transistors 930C and 931C and current source 932C. Transistors 930C and 931C have gates coupled to the drain of transistor 931C. The drain of transistor 931C is coupled to current source 932C and to the control terminals of transistors 904C and 905C. Consequently, the source of transistor 931C is a Vgs below the control terminal of transistor 905C, and has an associated voltage approximately equal to the voltage on the source terminal of transistor 905C. Of course, other equivalent circuit configurations could be used to generate the voltage on the second input terminal.

Current mirror 900C further illustrates another technique for generating the offset voltage in the differential amplifier. A predetermined offset voltage may be achieved by coupling a properly sized resistor 924C to the source of transistor 920C. Of course, for a bipolar implementation, a resistor would be coupled to the emitter of a differential input transistor.

Figure 9D:
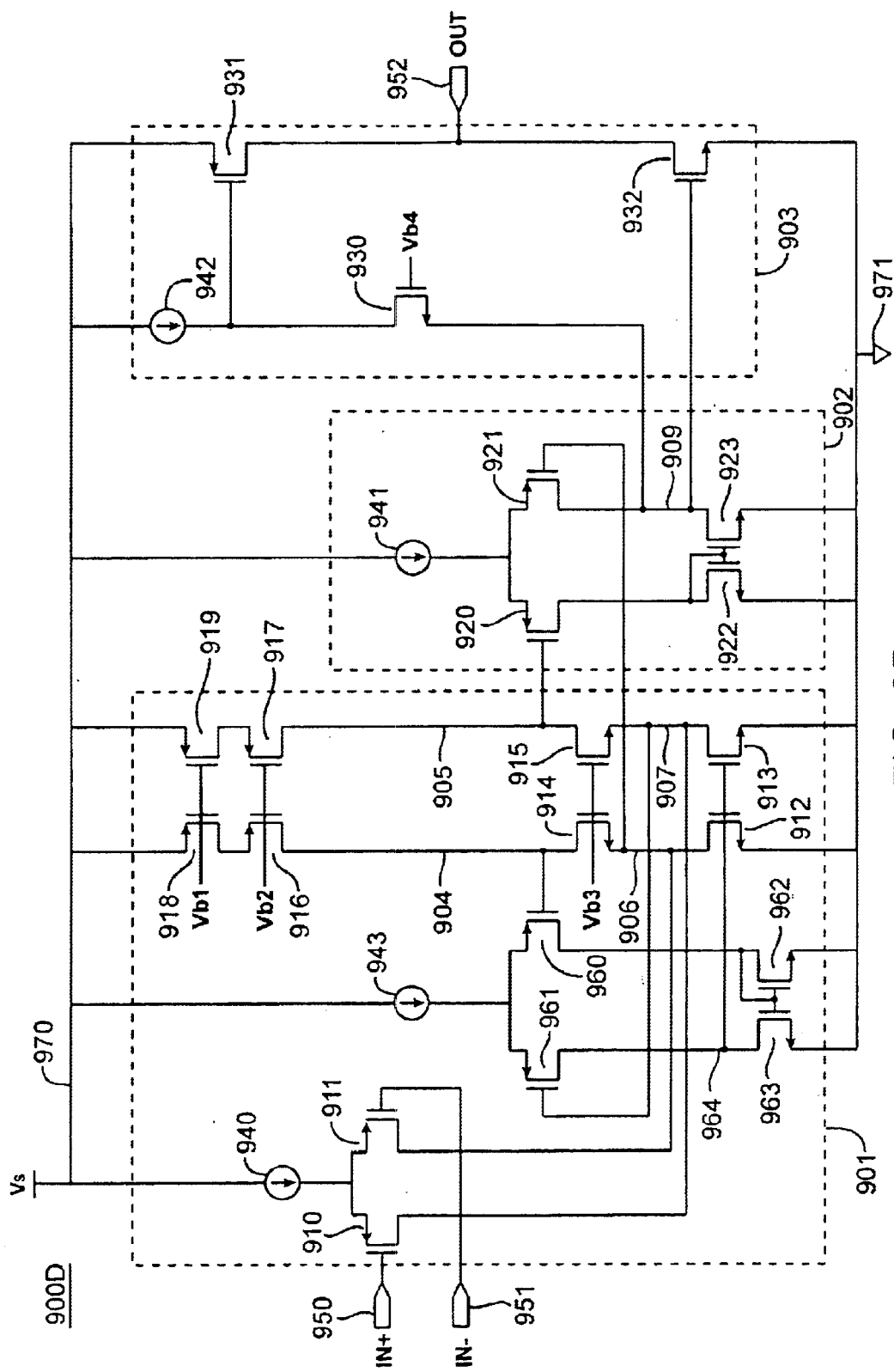
FIG. 9D illustrates an amplifier circuit utilizing the current mirror of FIG. 9A according to one embodiment of the present invention.

FIG. 9D illustrates an amplifier circuit 900D utilizing the current mirror of FIG. 9A according to one embodiment of the present invention. Amplifier 900D includes a cascode stage 901, differential stage 902, and output stage 903. Cascode stage 901, differential stage 902, and output stage 903 are substantially the same as described for amplifier 500 of FIG. 5, except that cascode stage 901 includes a current mirror as described in FIGS. 9A–B including an amplifier comprising transistors 960–963. The gate of PMOS transistor 960 is coupled to node 904, and the gate of PMOS transistor 961 is coupled to cascode node 907. The sources of transistors 960 and 961 are coupled to bias current source 943, and the drains of transistors 960 and 961 are coupled to NMOS load transistors 962 and 963, respectively. Transistors 960 and 961 may have different width to length ratios to create a designed-in offset voltage as described above. Amplifier transistors 960–963 maintain node 904 at a fixed voltage above node 907. The voltage difference between node 904 and 907 is equal to the designed-in offset voltage. Amplifier 900D may be configured so that transistors 914 and 915 have nominally equal Vds. To achieve this result, the designed-in offset in transistors 920 and 921, which controls Vds of transistor 915, should be matched with the designed-in offset in transistors 960 and 961, which controls the Vds of transistor 914. Matching offsets will control differential unbalance caused by Early Voltage effects of transistors 914 and 915. Thus, the circuit will exhibit very low systemic input referred offset voltages.

Figure 10:
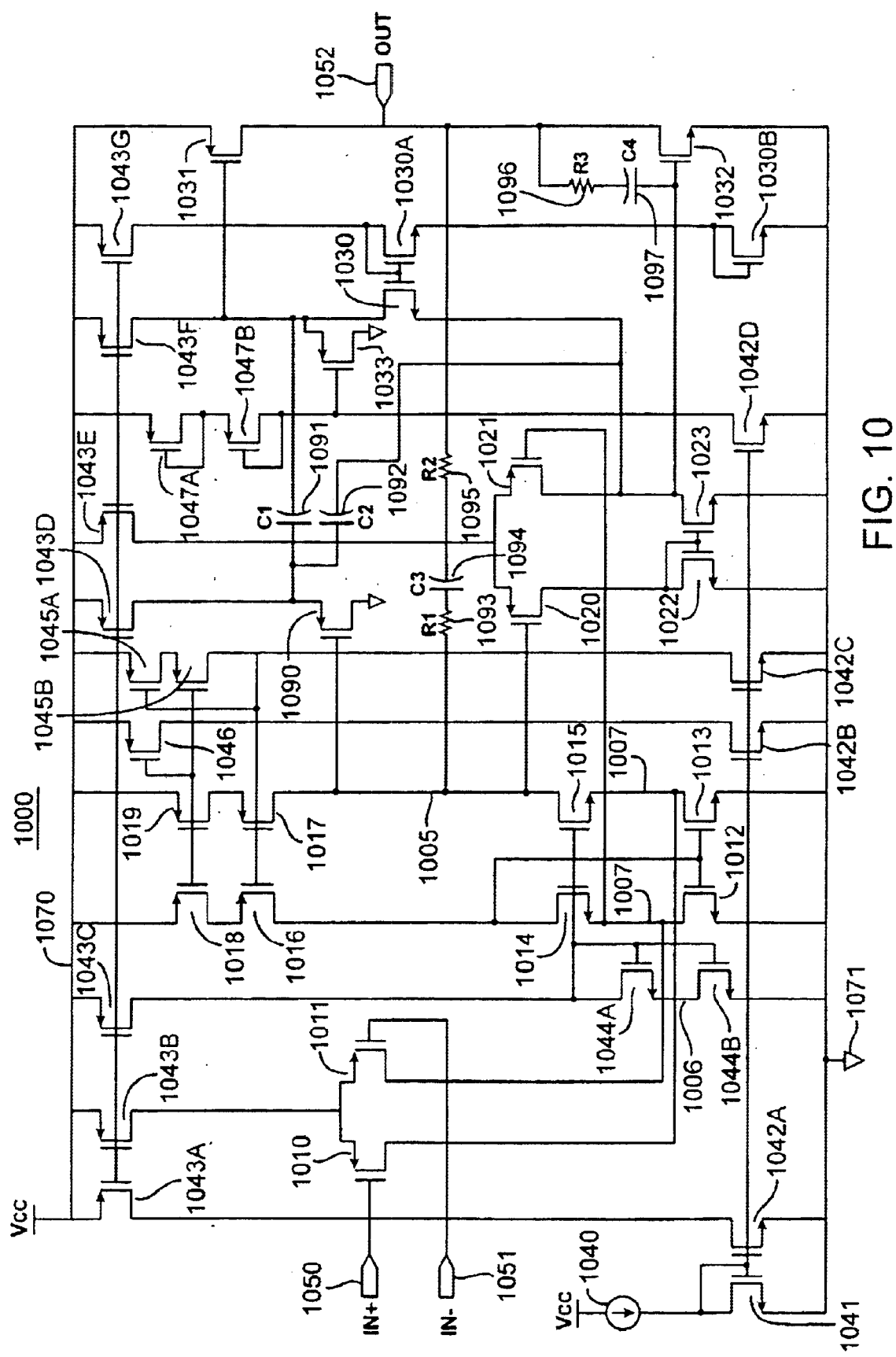
FIG. 10 illustrates an amplifier according to another embodiment of the present invention.

FIG. 10 illustrates an amplifier 1000 according to another embodiment of the present invention. Amplifier 1000 includes a folded cascode input stage (i.e., transistors 1010–1019), differential stage (i.e., transistors 1020–1023), common gate stage (i.e., transistor 1030), and output transistors 1031–1032, the operation of which was described for amplifier 500 of FIG. 5. Amplifier 1000 illustrates biasing and bypass techniques according to one embodiment of the present invention. Biasing in amplifier 1000 is provided by current source 1040 and transistors 1041, 1042A–D, 1043A–G, 1044A–B, 1045A–B, 1046, and 1047A–B, and 1030A–B. Embodiments of the invention may include coupling the gate of transistor 1021 to cascode node 1006, 1007, or 1008 (i.e., the sources of transistors 1014, 1015, or 1044A) because each of these nodes has an associated voltage approximately equal to the voltage on the source terminal of cascode transistor 1015. In particular, these nodes are all a Vgs below the voltage on the gate of transistor 1015. With regard to transistor 1044A, this is evident because transistor 1044A has a diode connected drain and gate coupled to the gate of cascode transistor 1015.

Amplifier 1000 includes a feed forward circuit comprising transistor 1090 and capacitors C1 1091 and C2 1092. Transistor 1090 and load transistor 1043D are configured as a source follower that receives an input from the cascode stage output (node 1005) and drive capacitors 1091 and 1092. The source follower and capacitor 1091 are coupled to the cascode stage output and the output of common gate transistor 1030. The source follower stage and capacitor 1092 are coupled to the cascode stage output and the output of the differential stage.

Amplifier 1000 further includes transistor 1033, which may be included for clamping the gate of output transistor 1031 such that it cannot completely turn off. Moreover, resistor R1 1093, capacitor 1094, resistor R2 1095 may be coupled between the output of the cascode stage and output for additional stabilization. Finally, resistor R3 1096 and C4 1097 may also be included for compensating transistor 1032. The combination of R1, R2, R3, C3 and C4 is called "Nested Miller Compensation" and is well known in the art.

Figure 11:
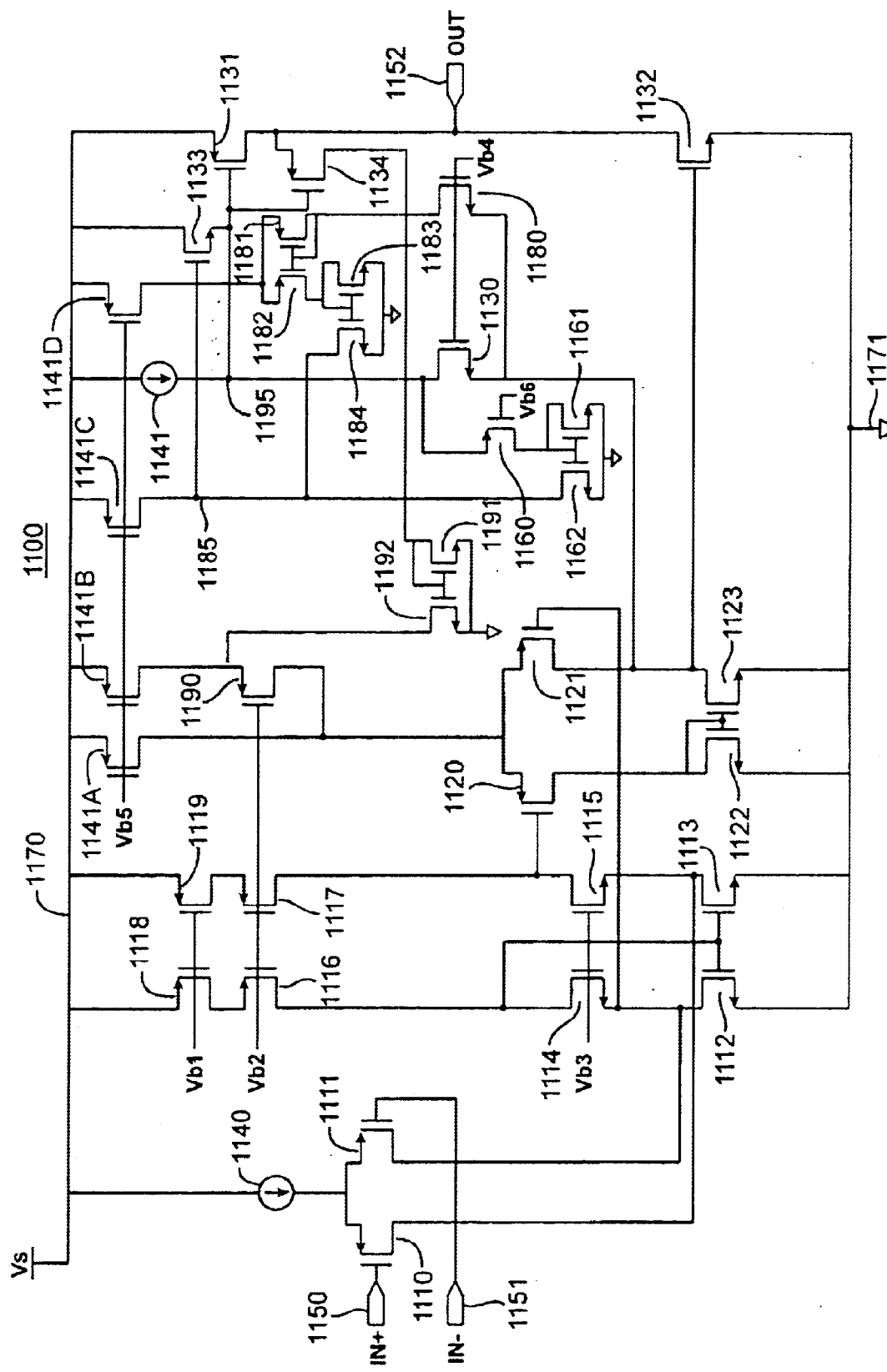
FIG. 11 illustrates an amplifier according to another embodiment of the present invention.

FIG. 11 illustrates an amplifier 1100 according to another embodiment of the present invention. Amplifier 1100 includes a folded cascode input stage (i.e., transistors 1110–1119), differential stage (i.e., transistors 1120–1123), common gate stage (i.e., transistor 1130), and output transistors 1131–1132, the operation of which was described for amplifier 500 of FIG. 5. Amplifier 1100 illustrates techniques for fine tuning amplifier performance according to one embodiment of the present invention. When the output of amplifier 1100 swings from the positive supply toward the negative supply, PMOS output transistor 1131 must be shut off quickly as NMOS transistor 1132 begins to conduct current. If the current in transistor 1131 is not turned off fast, both transistors will be conducting current at the same time, leading to problematic "shoot through" currents. Consequently, transistors 1133, 1180–1184 and 1160–1162 are included to charge node 1195 and turn off output transistor 1131 when the voltage at the output of the differential stage increases, signaling the activation of output transistor 1132.

During steady state operation, current source 1141 is equal to the sum of the drain current in transistor 1130 and the source current in transistor 1160. Transistor 1180 senses the drain current in transistor 1130, which is a function of the voltage at the output of the differential stage. Transistor 1184 produces a scaled version of the current in transistor 1180 into node 1185. Current mirror transistors 1161 and 1162 produce a scaled version of the source current in transistor 1160. The scaled versions of the currents in transistors 1130 and 1160 are then summed at node 1185. If the sum is less than a current threshold set by current source 1141C, then the voltage on node 1185 increases. Consequently, NMOS transistor 1133 sources current into the gate of output transistor 1131, acting in concert with current source 1141 to increase the gate voltage of transistor 1131, thereby turning transistor 1131 off and reducing "shoot through" currents.

Another characteristic improved by amplifier 1100 relates to improving the high frequency gain when the output voltage of amplifier 1100 is near the positive supply. Transistors 1134 and 1190–1192 are provided to improve stability in such a situation. As the voltage on the output of amplifier 1100 increases toward the positive supply, the voltage on node 1195 is decreasing. As the voltage on node 1195 decreases, the gate-to-drain voltage of transistor 1131 becomes more negative, and transistor 1131 will enter the triode region of operation. PMOS transistor 1134 is designed to turn on as transistor 1131 enters the triode region. PMOS transistor 1134 turns on and begins to increase the current through transistors 1191–1192, which reduces the current in transistor 1190. Thus, the current from the differential stage is reduced as the output voltage increases by the action of transistors 1134 and 1190–1192. Consequently, as the output voltage increases toward the positive supply, the bandwidth of the amplifier is reduced because $g_m$ decreases as the current into the differential stage is reduced. Therefore, the high frequency gain is reduced when the voltage on the output of the amplifier is near the positive supply, thereby providing improved stability.

Having fully described alternative embodiments of the present invention, other equivalent or alternative techniques for providing high gain at low supply voltage levels according to the present invention will be apparent to those skilled in the art. For example, embodiments of the present invention may be implemented using different technologies, such as at least bipolar, MOS, or BiCMOS. Consequently, other transistor structures may be substituted for some or all of the MOS transistors shown above. In particular, bipolar transistors may be used. Bipolar transistors include a base terminal, emitter terminal, and collector terminal. The base is typically the input control terminal corresponding to the gate in MOS circuits as is well known in the art. In other embodiments, opposite polarity devices (i.e., N-type vs. P-type) may be substituted to arrive at equivalent circuits according to well-understood circuit principles. In yet other embodiments, particular transistors may be added or removed from the particular embodiments disclosed above to arrive at equivalent circuits that practice the concepts disclosed herein. These equivalents and alternatives along with the understood obvious changes and modifications are intended to be included within the scope of the present invention as defined by the following claims.

What is claimed is:

1. An amplifier circuit comprising:
   a cascode stage including a cascode transistor, the cascode transistor having a control terminal and first and second terminals, wherein the second terminal has an associated first voltage when the circuit is operating; and
   a first differential stage having a first input coupled to the first terminal of the cascode transistor and a second input coupled to a node having an associated voltage approximately equal to the first voltage on the second terminal of the cascade transistor when the circuit is operating,
   wherein a voltage difference between the first and second terminals of the cascode transistor is controlled by a voltage difference between the first input and second input of the first differential stage.

2. The amplifier circuit of claim 1 wherein the cascode stage further comprises a second transistor having a control terminal and first and second terminals, wherein the control terminal of the second transistor is coupled to the control terminal of the cascode transistor and the second terminal of the second transistor is coupled to the second input of the first differential stage.

3. The amplifier circuit of claim 1 wherein the first differential stage has an offset voltage, the offset voltage being sufficient for biasing the first cascode transistor in the saturation region of operation.

4. The amplifier circuit of claim 3 wherein the first differential stage comprises first and second input transistors, the first and second input transistors having different characteristics so that the first differential stage generates an offset voltage.

5. The amplifier circuit of claim 4 wherein the first differential stage comprises first and second input transistors having different width to length ratios, and in accordance therewith, the first differential stage generates the offset voltage.

6. The amplifier circuit of claim 3 wherein the first differential stage comprises first and second input transistors, and wherein at least one of the first and second input transistors is coupled to a resistor so that the first differential stage generates an offset voltage.

7. The amplifier circuit of claim 2 further comprising a second differential stage having a first input coupled to a first terminal of the second transistor, a second input coupled to the second terminal of the cascode transistor, and an output coupled to the cascode stage for controlling the current in the cascode transistor and second transistor.

8. The amplifier circuit of claim 7 wherein the second differential stage includes an offset voltage to maintain the first terminal of the second transistor at an approximately fixed voltage above the second terminal of the cascode transistor.

9. The amplifier circuit of claim 7 wherein the first differential stage has a first offset voltage and the second differential stage includes a second offset voltage, wherein the first and second offset voltages are approximately matched to bias the first cascode transistor and the second transistor on the edge of the saturation region of operation.

10. The amplifier circuit of claim 1 wherein said amplifier comprises bipolar, MOS, or BiCMOS transistors.

11. An amplifier circuit comprising:
a cascode stage including first and second cascode transistors, the first and second cascode transistor having gates coupled to a first bias voltage; and
a first differential stage having a first input coupled to a drain terminal of the first cascode transistor, and a second input coupled to a source terminal of the second cascode transistor;
wherein the first differential stage includes a designed-in offset voltage.

12. The amplifier circuit of claim 11 wherein the amplifier further comprises first and second input transistors having control terminals to receive an input voltage, and in accordance therewith, generate a differential current in the cascode stage.

13. The amplifier circuit of claim 12 wherein the differential current is coupled to a source terminal of the first cascode transistor and the source terminal of the second cascode transistor.

14. The amplifier circuit of claim 11 wherein the cascode stage is connected in a folded cascode configuration.

15. The amplifier circuit of claim 11 wherein the offset voltage is greater than the voltage required to maintain the first cascode transistor in the saturation region of operation.

16. The amplifier circuit of claim 11 wherein differential stage includes first and second input transistors that have different width to length ratios to produce the offset voltage.

17. The amplifier circuit of claim 11 further comprising a second differential stage having a first input coupled to the drain terminal of the first cascode transistor, a second input coupled to the source terminal of the second cascode transistor, and an output.

18. The amplifier circuit of claim 17 wherein the second differential stage includes a designed-in offset voltage.

19. The amplifier circuit of claim 17 wherein the first differential stage and the second differential stage comprise opposite polarity devices.

20. The amplifier circuit of claim 17 further comprising first and second level shift circuits coupled to first and second inputs of the second differential stage.

21. The amplifier circuit of claim 17 further comprising a first output transistor having a control terminal coupled to an output of the first differential stage and a second output transistor having a control terminal coupled to the output of the second differential stage.

22. An amplifier circuit comprising:
a differential stage; and
a voltage dependent load coupled to an output node of the differential stage, wherein a voltage on the output node changes from a first voltage to a second voltage more positive than the first voltage,
wherein the gain of the differential stage increases as the voltage on the differential stage output node increases from the first voltage, reaches a maximum when the voltage on the differential output node is in a first voltage range between the first voltage and second voltage, and decreases as the voltage on the differential output node increases toward the second voltage.

23. The amplifier circuit of claim 22 wherein the voltage dependent load comprises a common gate stage coupled to the output of the differential stage.

24. The amplifier circuit of claim 23 wherein the differential stage comprises first and second input transistors.

25. The amplifier circuit of claim 24 wherein the differential stage further comprises a current mirror.

26. The amplifier circuit of claim 23 further comprising:
a first output transistor having a control terminal coupled to an output of the common gate stage; and
a second output transistor having a control terminal coupled to the output of the differential stage,
wherein the first and second output transistors are opposite polarity device types.

27. The amplifier circuit of claim 26 wherein the common gate stage comprises a NMOS transistor having a source coupled to the output of the differential stage, a drain coupled to a gate of the first output transistor, and a gate coupled to receive a bias voltage.

28. The amplifier circuit of claim 26 wherein the first output transistor is a PMOS transistor and the second output transistor is an NMOS transistor.

29. The amplifier circuit of claim 25 wherein the differential stage includes a first bias current, the current mirror comprises first and second transistors coupled to receive the first bias current, and the common gate stage includes a second bias current, wherein the first transistor is sized to receive a first portion of the first bias current, and the second transistor is sized to receive a second portion of the first bias current in addition to the second bias current of the common gate stage, and wherein the gain of the differential stage changes in accordance with the input impedance of the common gate stage and the output impedance of at least one of the differential stage input transistors.

30. An amplifier circuit comprising:
a cascode stage including a cascade transistor, the cascade transistor having a control terminal and first and second terminals, wherein the second terminal has an associated first voltage when the circuit is operating;
a first differential stage having a first input coupled to the first terminal of the cascode transistor, a second input coupled to a node having an associated voltage approximately equal to the first voltage on the second terminal of the cascode transistor when the circuit is operating, and an output;
a common gate stage having an input coupled to the output of the first differential stage; and
an output stage including first and second output transistors, wherein at least one of the first and second output transistors includes a control terminal coupled to the output of the first differential stage.

31. The amplifier circuit of claim 30 wherein the cascade stage further comprises a second transistor having a control terminal and first and second terminals, wherein the control terminal of the second transistor is coupled to the control terminal of the cascode transistor and the second terminal of the second transistor is coupled to the second input of the first differential stage.

32. The amplifier circuit of claim 30 wherein the cascade transistor comprises a PMOS or an NMOS transistor.

33. The amplifier circuit of claim 30 wherein first differential stage includes an offset voltage sufficient for biasing the cascade transistor in the saturation region of operation.

34. The amplifier circuit of claim 33 wherein first differential stage includes first and second input transistors that have different width to length ratios to produce the offset voltage.

35. The amplifier circuit of claim 30 wherein the common gate stage comprises a transistor having a source coupled to the output of the first differential stage and a gate coupled to a bias voltage.

36. The amplifier circuit of claim 30 wherein a control terminal of the first output transistor is coupled to an output of the common gate stage and a control terminal of the second output transistor is coupled to the output of the first differential stage.

37. The amplifier circuit of claim 30 wherein the cascode stage is connected in a folded cascode configuration.

38. The amplifier circuit of claim 30 further comprising at least one feed forward circuit.

39. The amplifier circuit of claim 38 wherein the feed forward circuit is coupled between the cascode stage and the output of the first differential stage.

40. The amplifier circuit of claim 38 wherein the feed forward circuit is coupled between the cascode stage and an output of the common gate stage.

* * * * *